(12) United States Patent
Xiao et al.

(10) Patent No.: US 10,784,056 B2
(45) Date of Patent: Sep. 22, 2020

(54) SWITCH ASSEMBLY AND POWER SUPPLY SYSTEM

(71) Applicant: VERTIV ENERGY SYSTEMS, INC., Lorain, OH (US)

(72) Inventors: Junmei Xiao, Guangdong (CN); Zhongchang Sun, Guangdong (CN)

(73) Assignee: VERTIV ENERGY SYSTEMS, INC., Lorain, OH (US)

( * ) Notice: Subject to any disclaimer, the term of this patent is extended or adjusted under 35 U.S.C. 154(b) by 0 days.

(21) Appl. No.: 16/415,146

(22) Filed: May 17, 2019

(65) Prior Publication Data

US 2020/0203089 A1 Jun. 25, 2020

(30) Foreign Application Priority Data

Dec. 24, 2018 (CN) .................... 2018 2 2183740 U

(51) Int. Cl.
*H01H 1/58* (2006.01)
*H01R 12/55* (2011.01)
*H01R 9/24* (2006.01)

(52) U.S. Cl.
CPC ......... *H01H 1/5805* (2013.01); *H01R 9/2466* (2013.01); *H01R 12/55* (2013.01)

(58) Field of Classification Search
CPC .................. H01R 9/096; H01R 9/2466; H01R 12/72–737; H01R 12/55; H01H 1/58; H01H 1/5805; H01H 71/08; H01H 73/20
USPC ...................... 439/65; 200/51 R, 51.02–51.06
See application file for complete search history.

(56) References Cited

U.S. PATENT DOCUMENTS

| | | | | |
|---|---|---|---|---|
| 4,863,388 | A * | 9/1989 | Reimer ................. | H01R 12/83 439/31 |
| 5,350,889 | A * | 9/1994 | Lauritsen ............. | H01H 1/5805 200/1 B |
| 6,690,584 | B2 * | 2/2004 | Uzuka .................... | G06F 1/184 361/778 |
| 7,261,600 | B2 * | 8/2007 | Park ........................ | H04N 5/77 386/E5.069 |
| 7,351,110 | B1 * | 4/2008 | Wu ......................... | G06F 3/023 439/638 |
| 2006/0046524 | A1 * | 3/2006 | Chen ...................... | G06F 1/266 439/65 |
| 2013/0314849 | A1 * | 11/2013 | Mazzullo ................ | H02B 1/04 361/631 |

(Continued)

*Primary Examiner* — Gary F Paumen
(74) *Attorney, Agent, or Firm* — Harness, Dickey & Pierce, P.L.C.

(57) ABSTRACT

A switch assembly and a power supply system are provided. The switch assembly includes a switch body having a two-pin plug, a first circuit board, and a second circuit board. The first circuit board is provided with a power supply terminal block and a group of female terminals. The group of female terminals includes a first female terminal, a second female terminal and a third female terminal. The first female terminal and the second female terminal are respectively plugged with two pins of the two-pin plug. The first female terminal is electrically connected to the power supply terminal block, and the second female terminal is electrically connected to the third female terminal. The second circuit board is provided with a load connection terminal and a male terminal electrically connected to the load connection terminal. The male terminal is plugged with the third female terminal.

11 Claims, 2 Drawing Sheets

(56) References Cited

U.S. PATENT DOCUMENTS

| | | | |
|---|---|---|---|
| 2016/0056554 A1* | 2/2016 | Costello | H01R 12/712 439/65 |
| 2016/0126706 A1* | 5/2016 | Melchor Saucedo | H05K 5/0069 361/626 |
| 2016/0149363 A1* | 5/2016 | Patel | H01R 27/02 439/638 |
| 2018/0019530 A1* | 1/2018 | Fu | H01R 13/11 |
| 2019/0356089 A1* | 11/2019 | Costello | H01R 13/6471 |

* cited by examiner

SWITCH ASSEMBLY AND POWER SUPPLY SYSTEM

This application claims the benefit and priority of Chinese Application No. 201822183740.X, filed on Dec. 24, 2018, the entire disclosure of which is incorporated herein by reference.

FIELD

The present disclosure relates to the field of electronic power technology, and in particular to a switch assembly and a power supply system.

BACKGROUND

The switch is an important part of the power supply system. The switch needs to be installed, debugged and replaced during the manufacture and maintenance of the power supply system. Therefore, the installation manner of the switch plays an important role in the overall performance of the power supply system. In the conventional technology, a current input end and a current output end of the switch are generally connected to the power supply system by using two cables, respectively. In this case, during the process of installation and maintenance, especially when the switch needs to be replaced, the cables need to be removed from two ends of the to-be-replaced switch, and then are connected to two ends of a new switch, which results in cumbersome operation and low efficiency. Further, the installation or replacement operation needs to be performed in a small space having a height of 1 U, resulting in operation difficulty.

SUMMARY

There are provided a switch assembly and a power supply system according embodiments of the present disclosure, to improve convenience of installation and maintenance of the switch assembly and reduce operation difficulty.

The switch assembly according the embodiment of the present disclosure includes a switch body having a two-pin plug, a first circuit board, and a second circuit board. The first circuit board is provided with a power supply terminal block and a group of female terminals. The group of female terminals includes a first female terminal and a second female terminal on one side of the first circuit board and a third female terminal on the other side of the first circuit board. The first female terminal and the second female terminal are respectively plugged with two pins of the two-pin plug. The first female terminal is electrically connected to the power supply terminal block, and the second female terminal is electrically connected to the third female terminal. The second circuit board is provided with a load connection terminal and a male terminal electrically connected to the load connection terminal. The male terminal is plugged with the third female terminal.

In an embodiment, the switch assembly further includes a current input cable. One end of the current input cable is electrically connected to the power supply terminal block, and the other end of the current input cable is electrically connected to a current output end of a power supply system.

In an embodiment, the power supply terminal block and the third female terminal are located on a same side of the first circuit board.

In an embodiment, the number of the load connection terminal is equal to the number of the switch body and is one or more. The second circuit board is provided with male terminals electrically connected to the load connection terminals in a one-to-one correspondence. The first circuit board is provided with groups of female terminals electrically connected to the male terminals in a one-to-one correspondence. The groups of female terminals are electrically connected to the switch bodies in a one-to-one correspondence.

In an embodiment, the number of the power supply terminal block is one or more. Each of the power supply terminal blocks is electrically connected to the first female terminal of at least one group of female terminals, and the first female terminal of each group of female terminals is electrically connected to one of the power supply terminal blocks.

In an embodiment, the power supply terminal block is soldered to the first circuit board; and/or the first female terminal, the second female terminal and the third female terminal are soldered to the first circuit board; and/or the load connection terminal is soldered to the second circuit board; and/or the male terminal is soldered to the second circuit board.

In the switch assembly according to the embodiment of the present disclosure, the two-pin plug of the switch body is plugged with the first female terminal and the second female terminal on the first circuit board. The current outputted from the power supply system flows to the power supply terminal block, and then flows to the switch body through the first female terminal. In a case that the switch body is turned on, a state between the two pins of the two-pin plug is a conducting state. In this case, the current can flow to the second female terminal through the switch body, and then flows from the third female terminal to the male terminal plugged with the third female terminal on the second circuit board, and finally flows to the load connection terminal to output to the load. In a case that the switch body is turned off, the state between the two pins of the two-pin plug is a non-conducting state. In this case, a loop from the current output end of the power supply system to the load is disconnected. With the switch assembly, the switch body is connected with the first circuit board in a plugging manner, so that the operation of installing or replacing the switch body is relatively simple, and the plugging operation is not limited even in a small space having a height of 1 U. Compared with the conventional technology, the convenience of installation and maintenance of the switch assembly can be improved and the operation difficulty can be reduced with this technical solution. Further, since no cable for connection is adopted for the switch body, manufacturing and maintenance costs can be reduced with this technical solution.

The power supply system according to the embodiment of the present disclosure includes the switch assembly described in any one of the above technical solutions. With the technical solutions, convenience of installation and maintenance of the power supply system can be improved.

Figure 1:
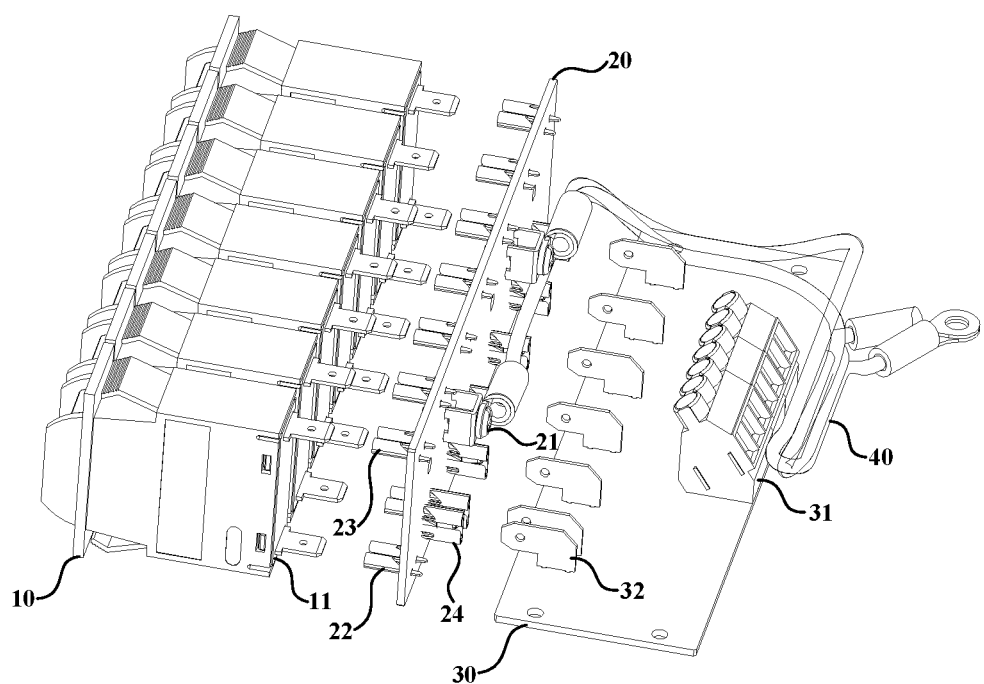
FIG. 1 is a schematic exploded view of a switch assembly according to an embodiment of the present disclosure.

| Reference numerals in the drawings: | |
|---|---|
| 10 switch body, | 20 first circuit board, |
| 30 second circuit board, | 11 two-pin plug, |
| 21 power supply terminal block, | 22 first female terminal, |
| 23 second female terminal, | 24 third female terminal, |
| 31 load connection terminal, | 32 male terminal, |
| 40 current input cable. | |

DETAILED DESCRIPTION OF EMBODIMENTS

There are provided a switch assembly and a power supply system according to embodiments of the present disclosure, to improve convenience of installation and maintenance of the switch assembly and reduce operation difficulty. In order to make objects, technical solutions and advantages of the present disclosure more clear, the following embodiments are described to further illustrate the present disclosure.

Figure 2:
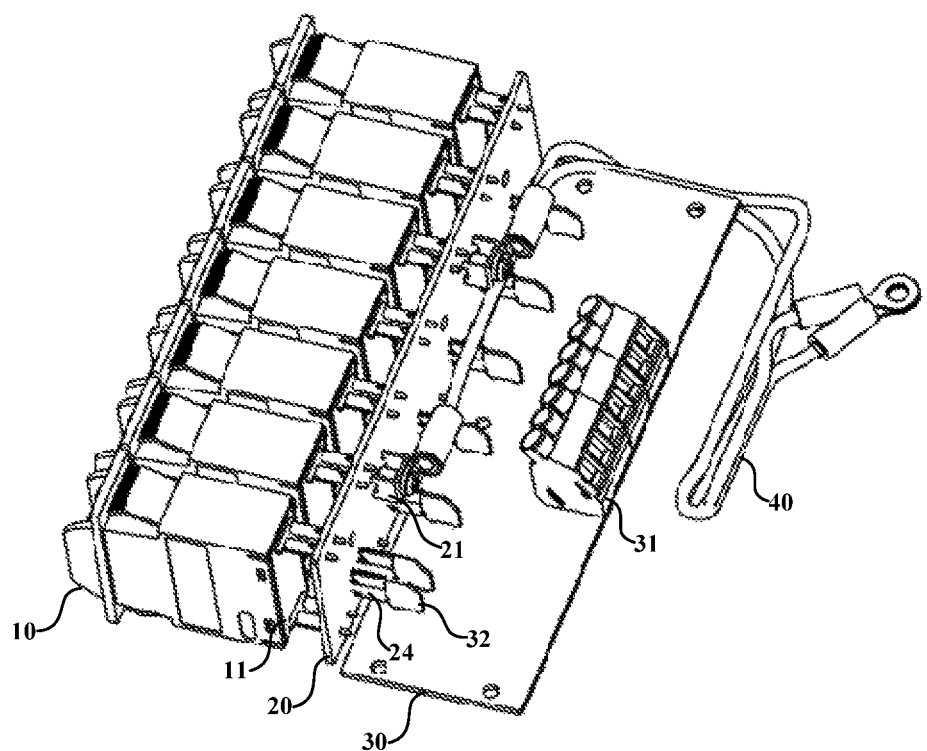
FIG. 2 is a schematic assembly view of the switch assembly according to the embodiment of the present disclosure.

As shown in FIG. 1 and FIG. 2, a switch assembly according to an embodiment of the present disclosure includes a switch body 10 having a two-pin plug 11, a first circuit board 20, and a second circuit board 30.

The first circuit board 20 is provided with a power supply terminal block 21 and a group of female terminals. The group of female terminals includes a first female terminal 22 and a second female terminal 23 on one side of the first circuit board 20 and a third female terminal 24 on the other side of the first circuit board 20. The first female terminal 22 and the second female terminal 23 are respectively plugged with two pins of the two-pin plug 11. The first female terminal 22 is electrically connected to the power supply terminal block 21. The second female terminal 23 is electrically connected to the third female terminal 24.

The second circuit board 30 is provided with a load connection terminal 31 and a male terminal 32 electrically connected to the load connection terminal 31. The male terminal 32 is plugged with the third female terminal 24.

A manner in which the power supply terminal block 21, the female terminals, the load connection terminal 31, the male terminal 32, and the like are connected with the circuit boards is not limited in the present disclosure. For example, in an embodiment of the present disclosure, the power supply terminal block 21, the first female terminal 22, the second female terminal 23 and the third female terminal 24 may be fixed to the first circuit board 20 by a soldering process. Similarly, the load connection terminal 31 and the male terminal 32 may be fixed to the second circuit board 30 by a soldering process.

It should be noted that parameters such as sizes or types of the first female terminal 22 and the second female terminal 23 may be determined according to a shape and a size of the two-pin plug 11 of the switch body 10. That is, the switch body 10 having different types of two-pin plugs 11 may be installed by providing different sizes or types of female terminals.

The specific type of the switch body 10 is not limited in the embodiments of the present disclosure. For example, the switch body 10 may be a ship type switch, a button switch, a key switch, or the like, as long as a state between the two pins of the two-pin plug 11 is a conducting state in a case that the switch body 10 is turned on, and the state between the two pins of the two-pin plug 11 is a non-conducting state in a case that the switch body 10 is turned off. The power supply terminal block 21 is electrically connected with power supply system, so that a current outputted by the power supply system can be conducted to the first circuit board 20. In a specific implementation, the switch assembly further includes a current input cable 40. One end of the current input cable 40 is electrically connected to the power supply terminal block 21, and the other end of the current input cable 40 is electrically connected to a current output end of the power supply system. The load connection terminal 31 is electrically connected with a load, so that the current that is conducted to the load connection terminal 31 can be smoothly outputted to the load. In a specific implementation, the load connection terminal 31 may be connected with the load via a cable, which is not described in detail herein.

In the switch assembly according to the embodiment of the present disclosure, the two-pin plug 11 of the switch body 10 is plugged with the first female terminal 22 and the second female terminal 23 on the first circuit board 20. The current outputted from the power supply system flows to the power supply terminal block 21, and then flows to the switch body 10 through the first female terminal 22. In the case that the switch body is turned on, the state between the two pins of the two-pin plug 11 is a conducting state. In this case, the current can flow to the second female terminal 23 through the switch body 10, and then flows from the third female terminal 24 to the male terminal 32 plugged with the third female terminal 24 on the second circuit board 30, and finally flows to the load connection terminal 31 to output to the load. In the case that the switch body 10 is turned off, the state between the two pins of the two-pin plug 11 is a non-conducting state. In this case, a loop from the current output end of the power supply system to the load is disconnected. With the switch assembly, the switch body 10 is connected with the first circuit board 20 in a plugging manner, so that the operation of installing or replacing the switch body is relatively simple, and the plugging operation is not limited even in a small space having a height of 1 U. Compared with the conventional technology, the convenience of installation and maintenance of the switch assembly can be improved and the operation difficulty can be reduced with this technical solution. Further, since no cable for connection is adopted for the switch body 10, manufacturing and maintenance costs can be reduced with this technical solution.

As shown in FIG. 1, in a specific embodiment of the present disclosure, the power supply terminal block 21 and the third female terminal 24 are located on a same side of the first circuit board 20. Since the switch body 10 is plugged on the side of the first circuit board 20 provided with the first female terminal 22 and the second female terminal 23, the power supply terminal block 21 can be prevented from interfering the plugging operation of the switch body 10 with this technical solution.

In an embodiment of the present disclosure, the number of the load connection terminal 31 is equal to the number of the switch body 10 and is one or more. The second circuit board 30 is provided with male terminals 32 electrically connected to the load connection terminals 31 in a one-to-one correspondence. The first circuit board 20 is provided with groups of female terminals electrically connected to the male terminals 32 in a one-to-one correspondence. The groups of female terminals are electrically connected to the switch bodies 10 in a one-to-one correspondence. With this technical solution, in a case that multiple load connection terminals 31 and multiple switch bodies 10 are provided, the power supply system can supply power to multiple loads. It should be noted that, in the case that the multiple switch bodies 10 are provided, spacing between first female terminals 22 or second female terminals 23 of adjacent groups of female terminals is designed according to the overall size of the switch body 10 to avoid causing interference when adjacent switch bodies 10 are plugged in.

In the above embodiment, the number of the power supply terminal block 21 may be one or more. For example, as shown in FIG. 1, the first circuit board is provided with two power supply terminal blocks 21, and each of the power supply terminal blocks 21 is electrically connected to the first female terminal 22 of at least one group of female terminals, and the first female terminal 22 of each group of female terminals is electrically connected to one of the power supply terminal blocks 21. With the technical solution of the embodiment, in the case that the power supply system supplies power to the multiple loads, the current supplied to the multiple loads can be outputted through the multiple power supply terminal blocks, so that the load borne by each of the power supply terminal blocks is not excessively large, thereby improving usage reliability of the switch assembly.

A power supply system is further provided according to an embodiment of the present disclosure, including the switch assembly described in any one of the above technical solutions. With the technical solutions, convenience of installation and maintenance of the power supply system can be improved.

It is apparent that those skilled in the art can make various modifications and variations to the present disclosure without departing from the spirit and scope of the present disclosure. In this case, if the modifications and variations of the present disclosure fall within the scope of the claims of the present disclosure and equivalent technologies thereof, the present disclosure is intended to include the modifications and variations.

The invention claimed is:

1. A switch assembly, characterized in that the switch assembly comprises:
    a switch body having a two-pin plug;
    a first circuit board; and
    a second circuit board, wherein
    the first circuit board is provided with a power supply terminal block and a group of female terminals, the group of female terminals comprises a first female terminal and a second female terminal on one side of the first circuit board and a third female terminal on the other side of the first circuit board, the first female terminal and the second female terminal are respectively plugged with two pins of the two-pin plug, the first female terminal is electrically connected to the power supply terminal block, the second female terminal is electrically connected to the third female terminal; and
    the second circuit board is provided with a load connection terminal and a male terminal electrically connected to the load connection terminal, and the male terminal is plugged with the third female terminal.

2. The switch assembly according to claim 1, characterized in that the switch assembly further comprises:
    a current input cable, wherein one end of the current input cable is electrically connected to the power supply terminal block, and the other end of the current input cable is electrically connected to a current output end of a power supply system.

3. The switch assembly according to claim 1, characterized in that the power supply terminal block and the third female terminal are located on a same side of the first circuit board.

4. The switch assembly according to claim 1, characterized in that the number of the load connection terminal is equal to the number of the switch body and is one or more, the second circuit board is provided with male terminals electrically connected to the load connection terminals in a one-to-one correspondence, and the first circuit board is provided with groups of female terminals electrically connected to the male terminals in a one-to-one correspondence, and the groups of female terminals are electrically connected to the switch bodies in a one-to-one correspondence.

5. The switch assembly according to claim 4, characterized in that the number of the power supply terminal block is one or more, each of the power supply terminal blocks is electrically connected to the first female terminal of at least one group of female terminals, and the first female terminal of each group of female terminals is electrically connected to one of the power supply terminal blocks.

6. The switch assembly according to claim 1, characterized in that
    the power supply terminal block is soldered to the first circuit board; and/or
    the first female terminal, the second female terminal and the third female terminal are soldered to the first circuit board; and/or
    the load connection terminal is soldered to the second circuit board; and/or
    the male terminal is soldered to the second circuit board.

7. The switch assembly according to claim 2, characterized in that
    the power supply terminal block is soldered to the first circuit board; and/or
    the first female terminal, the second female terminal and the third female terminal are soldered to the first circuit board; and/or
    the load connection terminal is soldered to the second circuit board; and/or
    the male terminal is soldered to the second circuit board.

8. The switch assembly according to claim 3, characterized in that
    the power supply terminal block is soldered to the first circuit board; and/or
    the first female terminal, the second female terminal and the third female terminal are soldered to the first circuit board; and/or
    the load connection terminal is soldered to the second circuit board; and/or
    the male terminal is soldered to the second circuit board.

9. The switch assembly according to claim 4, characterized in that
    the power supply terminal block is soldered to the first circuit board; and/or
    the first female terminal, the second female terminal and the third female terminal are soldered to the first circuit board; and/or
    the load connection terminal is soldered to the second circuit board; and/or
    the male terminal is soldered to the second circuit board.

10. The switch assembly according to claim 5, characterized in that
    the power supply terminal block is soldered to the first circuit board; and/or
    the first female terminal, the second female terminal and the third female terminal are soldered to the first circuit board; and/or
    the load connection terminal is soldered to the second circuit board; and/or
    the male terminal is soldered to the second circuit board.

11. A power supply system comprising the switch assembly according to claim 1.

* * * * *